United States Patent
Kim et al.

(10) Patent No.: US 9,142,610 B2
(45) Date of Patent: Sep. 22, 2015

(54) SEMICONDUCTOR DEVICE INCLUDING SUPPORTERS ON A LOWER ELECTRODE THEREOF AND METHOD OF FABRICATING THE SAME

(71) Applicant: SAMSUNG ELECTRONICS CO., LTD., Suwon-si, Gyeonggi-do (KR)

(72) Inventors: Hong-Gun Kim, Hwaseong-si (KR); Kwang-Tae Hwang, Seoul (KR); Young-Min Ko, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/074,959

(22) Filed: Nov. 8, 2013

(65) Prior Publication Data

US 2014/0145303 A1   May 29, 2014

(30) Foreign Application Priority Data

Nov. 26, 2012   (KR) .......................... 10-2012-0134532

(51) Int. Cl.
*H01L 27/00* (2006.01)
*H01L 49/02* (2006.01)
*H01L 27/108* (2006.01)

(52) U.S. Cl.
CPC .......... *H01L 28/60* (2013.01); *H01L 27/10808* (2013.01); *H01L 27/10817* (2013.01); *H01L 27/10852* (2013.01); *H01L 28/82* (2013.01); *H01L 28/87* (2013.01); *H01L 28/90* (2013.01)

(58) Field of Classification Search
CPC ..................... H01L 27/10852; H01L 27/10817
USPC .................................................. 257/307, 308
See application file for complete search history.

(56) References Cited

U.S. PATENT DOCUMENTS

| | | | | |
|---|---|---|---|---|
| 4,974,040 A | * | 11/1990 | Taguchi et al. | 257/306 |
| 5,135,883 A | * | 8/1992 | Bae et al. | 438/396 |
| 5,155,657 A | * | 10/1992 | Oehrlein et al. | 361/313 |
| 5,187,548 A | * | 2/1993 | Baek et al. | 257/308 |
| 5,206,787 A | * | 4/1993 | Fujioka | 257/307 |
| 5,223,729 A | * | 6/1993 | Kudoh et al. | 257/296 |
| 5,262,662 A | * | 11/1993 | Gonzalez et al. | 257/307 |
| 5,278,437 A | * | 1/1994 | Wakamiya et al. | 257/309 |
| 5,315,141 A | * | 5/1994 | Kim | 257/308 |
| 5,323,037 A | * | 6/1994 | Su | 257/306 |
| 5,650,647 A | * | 7/1997 | Taguchi et al. | 257/308 |
| 5,670,806 A | * | 9/1997 | Jun | 257/306 |
| 5,696,395 A | * | 12/1997 | Tseng | 257/308 |
| 5,744,833 A | * | 4/1998 | Chao | 257/308 |

(Continued)

FOREIGN PATENT DOCUMENTS

| | | |
|---|---|---|
| KR | 10-0654353 B1 | 11/2006 |
| KR | 10-2009-0005919 A | 1/2009 |

(Continued)

*Primary Examiner* — Ngan Ngo
(74) *Attorney, Agent, or Firm* — Lee & Morse, P.C.

(57) ABSTRACT

A semiconductor device and a method of fabricating the same, the device including a substrate having a transistor formed thereon; a plurality of lower electrodes formed on the substrate; a first supporter and a second supporter on the plurality of lower electrodes; a dielectric film formed on the lower electrode, the first supporter, and the second supporter; and an upper electrode formed on the dielectric film, wherein the first and second supporters are positioned between the lower electrodes, and the first and second supporters include a first material and a second material.

5 Claims, 11 Drawing Sheets

(56) References Cited

U.S. PATENT DOCUMENTS

| | | | | |
|---|---|---|---|---|
| 5,753,949 A * | 5/1998 | Honma et al. | | 257/309 |
| 5,783,848 A * | 7/1998 | Chao | | 257/296 |
| 5,903,024 A * | 5/1999 | Hsu | | 257/303 |
| 5,909,045 A * | 6/1999 | Chao | | 257/308 |
| 5,910,667 A * | 6/1999 | Hsu | | 257/306 |
| 5,952,688 A * | 9/1999 | Madan | | 257/303 |
| 5,973,350 A * | 10/1999 | Wu | | 257/308 |
| 5,981,992 A * | 11/1999 | Calpine Kenney | | 257/308 |
| 6,027,969 A * | 2/2000 | Huang et al. | | 438/254 |
| 6,064,085 A * | 5/2000 | Wu | | 257/296 |
| 6,083,790 A * | 7/2000 | Lin et al. | | 438/256 |
| 6,097,052 A * | 8/2000 | Tanaka et al. | | 257/306 |
| 6,097,053 A * | 8/2000 | Ando | | 257/308 |
| 6,133,600 A * | 10/2000 | Sandhu | | 257/308 |
| 6,144,058 A * | 11/2000 | Ema | | 257/308 |
| 6,188,100 B1 * | 2/2001 | Hermes | | 257/309 |
| 6,232,648 B1 * | 5/2001 | Wu | | 257/534 |
| 6,281,542 B1 * | 8/2001 | Wu | | 257/308 |
| 6,333,227 B1 * | 12/2001 | Kim et al. | | 438/255 |
| 6,476,437 B2 * | 11/2002 | Liaw | | 257/308 |
| 6,784,478 B2 * | 8/2004 | Merchant et al. | | 257/303 |
| 7,224,015 B1 * | 5/2007 | Skotnicki et al. | | 257/306 |
| 7,621,041 B2 * | 11/2009 | Banerji et al. | | 29/832 |
| 8,232,587 B2 * | 7/2012 | Tu | | 257/308 |
| 8,580,681 B2 * | 11/2013 | Sako | | 438/666 |
| 2001/0023958 A1 * | 9/2001 | Todorobaru et al. | | 257/307 |
| 2006/0076596 A1 * | 4/2006 | Ohkubo et al. | | 257/296 |
| 2011/0076819 A1 * | 3/2011 | Kim et al. | | 438/279 |
| 2011/0207303 A1 * | 8/2011 | Jeong et al. | | 438/487 |
| 2011/0207304 A1 * | 8/2011 | Kim et al. | | 438/487 |
| 2011/0291172 A1 * | 12/2011 | Hwang et al. | | 257/314 |
| 2012/0012920 A1 * | 1/2012 | Shin et al. | | 257/324 |
| 2012/0019980 A1 | 1/2012 | Cho et al. | | |
| 2012/0064680 A1 | 3/2012 | Oh et al. | | |
| 2012/0068242 A1 * | 3/2012 | Shin et al. | | 257/315 |
| 2012/0094453 A1 * | 4/2012 | Han et al. | | 438/269 |
| 2012/0115293 A1 * | 5/2012 | Noh et al. | | 438/239 |
| 2012/0267702 A1 * | 10/2012 | Jee et al. | | 257/324 |
| 2012/0276719 A1 * | 11/2012 | Han et al. | | 438/478 |
| 2013/0065381 A1 * | 3/2013 | Son et al. | | 438/479 |

FOREIGN PATENT DOCUMENTS

| | | |
|---|---|---|
| KR | 10-0885922 B1 | 2/2009 |
| KR | 10-2009-0041168 A | 4/2009 |
| KR | 10-2012-0022032 A | 3/2012 |

* cited by examiner

SEMICONDUCTOR DEVICE INCLUDING SUPPORTERS ON A LOWER ELECTRODE THEREOF AND METHOD OF FABRICATING THE SAME

CROSS-REFERENCE TO RELATED APPLICATION

Korean Patent Application No. 10-2012-0134532, filed on Nov. 26, 2012, in the Korean Intellectual Property Office, and entitled: "Semiconductor Device and Method for Fabricating the Same," is incorporated by reference herein in its entirety.

BACKGROUND

1. Field

Embodiments relate to a semiconductor device and a method of fabricating the same.

2. Description of the Related Art

With a trend toward high integration and micro-fabrication of a semiconductor device, technology for increasing capacitance of a dynamic random access memory (DRAM) device has been considered. Methods for increasing the capacitance within a limited area may include a method of using a high-k dielectric material in forming a dielectric film, a method of reducing a thickness of a dielectric film, a method of increasing the effective area of a lower electrode, or the like.

SUMMARY

Embodiments are directed to a semiconductor device and a method of fabricating the same.

The embodiments may be realized by providing a semiconductor device, including a substrate having a transistor formed thereon; a plurality of lower electrodes formed on the substrate; a first supporter and a second supporter on the plurality of lower electrodes; a dielectric film formed on the lower electrode, the first supporter, and the second supporter; and an upper electrode formed on the dielectric film, wherein the first and second supporters are positioned between the lower electrodes, and the first and second supporters include a first material and a second material.

The first supporter and the second supporter may be formed to be spaced apart from each other.

The first material may be SiCN, and the second material may be SiN.

The first and second supporters may further include materials other than the first and second materials.

The first and second supporters may be configured such that the second material is stacked on the first material, and the first material is stacked on the second material.

The first and second supporters may have thicknesses in a range of 50 Å to 3,000 Å.

The first material and the second material may each have an etch selectivity with respect to a mold oxide film for forming the lower electrodes.

The first and second materials may have lower etch rates with respect to LAL than the mold oxide film.

The embodiments may also be realized by providing a method of fabricating a semiconductor device, the method including forming a first mold oxide film on a substrate having a transistor thereon; sequentially forming a first supporter, a second mold oxide film, and a second supporter on the first mold oxide film; forming a plurality of holes by etching the first and second mold oxide films and the first and second supporters; forming lower electrodes in the plurality of holes; removing remaining portions of the first and second mold oxide films; and sequentially forming a dielectric film and an upper electrode on the lower electrode and the first and second supporters.

The first and second supporters may include a first material and a second material.

The first material may be SiCN, and the second material may be SiN.

Forming the first and second supporters may include stacking the second material on the first material and stacking the first material on the second material.

Forming the first and second supporters may include forming the first and second supporters using a first gas and a second gas as carrier gases, respectively.

The first gas may be nitrogen gas and the second gas may be helium gas.

The first and second supporters may have thicknesses in a range of 50 Å to 3,000 Å.

The embodiments may also be realized by providing a semiconductor device including a substrate including a unit device; a plurality of lower electrodes on the substrate; a first supporter and a second supporter on sides of each of the lower electrodes; a dielectric film on the lower electrode, the first supporter, and the second supporter; and an upper electrode on the dielectric film, wherein the first supporter and the second supporter are between adjacent ones of plurality of the lower electrodes, and the first supporter and the second supporter suppress bowing of the plurality of lower electrodes.

The first supporter and the second supporter may be spaced apart from each other in a direction perpendicular to a surface of the substrate.

The first and second supporters may include a first material and a second material.

The first material may be SiCN and the second material may be SiN.

The first and second supporters may have thicknesses in a range of 50 Å to 3,000 Å.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art. It is noted that the use of any and all examples, or exemplary terms provided herein is intended merely to better illuminate the embodiments and is not a limitation on the scope unless otherwise specified. Further, unless defined otherwise, all terms defined in generally used dictionaries may not be overly interpreted.

The embodiments will be described with reference to perspective views, cross-sectional views, and/or plan views, in which preferred embodiments may be shown. Thus, the profile of an exemplary view may be modified according to manufacturing techniques and/or allowances. For example, the embodiments are not intended to limit the scope, but cover all changes and modifications that can be caused due to a change in manufacturing process. Thus, regions shown in the drawings are illustrated in schematic form and the shapes of the regions are presented simply by way of illustration and not as a limitation.

In the following semiconductor device and method of fabricating the same, the semiconductor device may be provided, which may include a capacitor having a stable structure by forming a supporter between lower electrodes. For example, a double supporter structure may be used, and the supporter may be formed to have a double layered structure. The supporter may be formed using a carbon-based or carbon-containing material film (e.g., SiCN). In this case, the supporter may include carbon. Thus, a bowing characteristic of the supporter may be reduced. The embodiments may be applied to fabrication of a cell capacitor of a DRAM device or a metal insulator metal (MIM) capacitor of a logic device. In an implementation, the embodiments may also be applied to fabrication of other types of capacitors.

Figure 1:
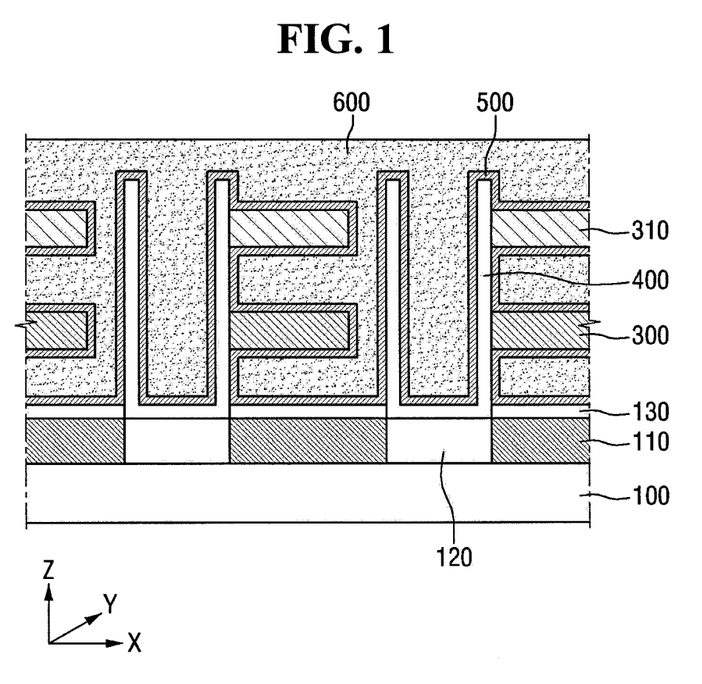
FIG. 1 illustrates a cross-sectional view of a semiconductor device according to an embodiment.

FIG. 1 illustrates a cross-sectional view of a semiconductor device according to an embodiment.

Referring to FIG. 1, the semiconductor device may include a substrate 100, an interlayer insulating film 110, a storage node contact 120, an etch stopper film 130, a lower electrode 400, a first supporter 300, a second supporter 310, a dielectric film 500, and an upper electrode 600.

The substrate 100 may include, e.g., a substrate made of Si, a rigid substrate such as a silicon on insulator (SOI) substrate, a gallium arsenic substrate, a silicon germanium substrate, a ceramic substrate, a quartz substrate, a glass substrate for a display, or a flexible plastic substrate made of polyimide, polyester, polycarbonate, polyethersulfone, polymethylmethacrylate, polyethylene naphthalate, or polyethyleneterephthalate.

The substrate 100 may include, e.g., unit devices (not shown) for fabricating semiconductor devices such as various kinds of active or passive devices. The unit devices may include, e.g., dynamic random access memory (DRAM) cell transistors. The substrate 100 may include device isolation films (not shown) for isolating the unit devices. The interlayer insulating film 110 (covering the unit devices) may be formed on the substrate 100. In addition, the substrate 100 may include conductive regions (not shown) electrically connected to the unit devices through the interlayer insulating film 110.

The interlayer insulating film 110 may be formed using, e.g., silicon oxides, such as borosilicate glass (BSG)), phosphosilicate glass (PSG), borophosphosilicate glass (BPSG), undoped silicate glass (USG), tetraethlyorthosilicate glass (TEOS), or high density plasma-CVD (HDP-CVD). The etch stopper film 130 may be made of, e.g., SiON or SiN. In an implementation, the etch stopper film 130 may be omitted.

The storage node contact 120 may be formed on the substrate 100 to electrically connect the conductive regions to the lower electrodes 400.

The lower electrode 400 may be formed on the storage node contact 120. For example, a plurality of the lower electrodes 400 may be formed on a plurality of storage node contacts 120, respectively. The lower electrodes 400 may be repeatedly formed in a first direction (e.g., in an x-axis direction) and a second direction (e.g., in a y-axis direction). For example, the lower electrodes 400 may be arrayed in a matrix configuration. In addition, the lower electrodes 400 may be alternately arranged with respect to lower electrodes 400 of adjacent rows or columns. If the lower electrodes 400 are alternately arranged with respect to each other, the dielectric film 500 may be be uniformly deposited by securing a space between the lower electrodes 400.

The lower electrode 400 may be for, e.g., a cylindrical capacitor, a stacked capacitor, or a concave capacitor. If the lower electrode 400 is formed in a cylinder type capacitor, all of a top surface and outer and inner surfaces of the lower electrode 400 may be used as capacitor regions.

The lower electrode 400 may be a film formed of a conductive material. A lower portion of the lower electrode 400 may be electrically connected to the storage node contact 120. The lower electrode 400 may be formed of, e.g., TIN, TiAlN, TAN, W, WN, Ru, $RuO_2$, $SrRuO_3$, Ir, $IrO_2$, Pt, or combinations thereof. In an implementation, the lower electrode 400 may be formed by, e.g., a metal organic chemical vapor deposition (MOCVD) method.

Figure 3:
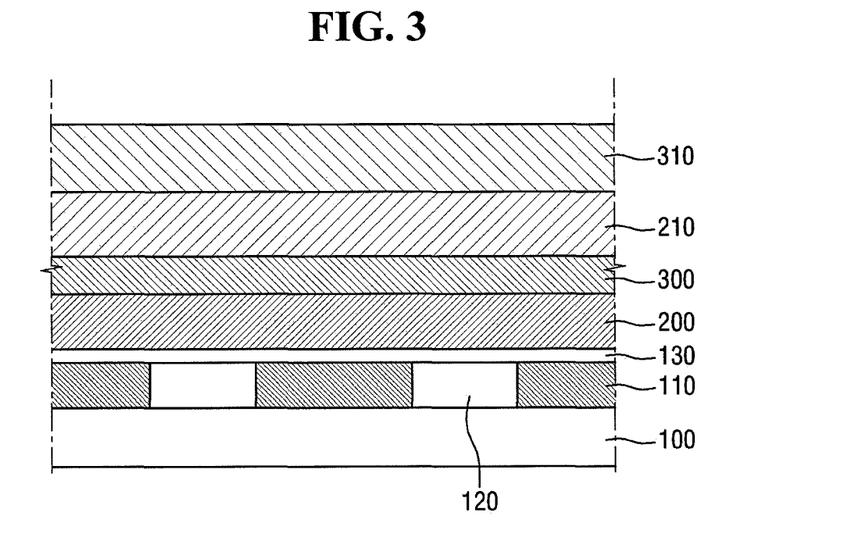

In manufacturing the device, the first supporter 300 may be formed on a first mold oxide film (see 200 of FIG. 3). The first supporter 300 may have a thickness in a z-axis direction of, e.g., 50 Å to 3,000 Å. The first supporter 300 may be formed of material having an etching selectivity with respect to the first mold oxide film 200 and a second mold oxide film 210 (see FIG. 3). For example, when LAL lift-off process is employed in a subsequent process for removing the first and second mold oxide films 200 and 210, the first supporter 300 may be formed of a material having a lower etch rate with respect to LAL and having a dielectric property. For example, the first supporter 300 may be formed of one of, e.g., SiN, SiCN, TaO, or $TiO_2$.

The first supporter 300 may have a double layered structure including a first material and a second material. For example, the first material may be SiCN, and the second material may be SiN. In an implementation, a carbonaceous component may be contained in SiCN in a proportion or amount of 0.1 to 15%. Including the carbonaceous component in the first supporter 300 may help reduce and/or prevent a bowing phenomenon of the first supporter 300. For example, with regard to a proportion of the carbonaceous component (capable of reducing the bowing phenomenon of the first supporter 300), if the proportion of the carbonaceous component is not less than 15%, improvement in the bowing phenomenon of the first supporter 300 may not be observed. In addition, the first supporter 300 may be configured such that the second material is stacked on the first material and the first material is stacked on the second material.

The dielectric film 500 may be formed on the lower electrode 400, the first supporter 300, the second supporter 310, and the etch stopper film 130. The dielectric film 500 may be formed by stacking a metal oxide film on a nitride film or a metal nitride film. Each of the metal oxide film, nitride film, and/or the metal nitride film may be formed by atomic layer deposition (ALD). The stacked structure of the dielectric film 500 is not limited to the double layered structure. In an implementation, the dielectric film 500 may have a structure of three or more layers. The nitride film or metal nitride film may be formed of, e.g., an aluminum nitride (AlN) film, a boron nitride (BN) film, a zirconium nitride ($Zr_3N_4$) film, or a hafnium nitride ($Hf_3N_4$) film. The metal oxide film may be formed of, e.g., a zirconium oxide ($ZrO_2$) film, a hafnium oxide ($HfO_2$) film, or a tantalum oxide ($Ta_2O_3$) film, alone or a combination thereof.

The upper electrode 600 may be formed on the dielectric film 500. For example, the upper electrode 600 may be formed of TiN, TiAlN, TaN, W, WN, Ru, $RuO_2$, $SrRuO_3$, Ir, $IrO_2$, or Pt, or a combination thereof.

The upper electrode 600 may be formed by, e.g., a metal organic chemical vapor deposition (MOCVD) method.

Hereinafter, a method for fabricating a semiconductor device according to an embodiment will be described with reference to FIGS. 2 to 8. FIGS. 2 to 8 illustrate cross-sectional views of stages in a method for fabricating a semiconductor device according to an embodiment.

Figure 2:
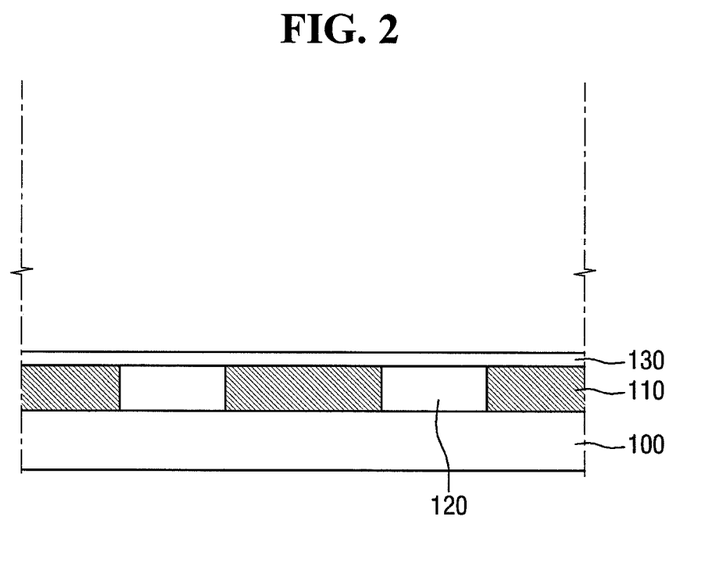
FIGS. 2 to 8 illustrate cross-sectional views of stages in a method for fabricating a semiconductor device according to an embodiment.

Referring first to FIG. 2, the interlayer insulating film 110 and the storage node contact 120 may be formed on the substrate 100. The etch stopper film 130 may then be formed.

Referring to FIG. 3, the first mold oxide film 200, the first supporter 300, the second mold oxide film 210, and the second supporter 310 may be sequentially formed on the etch stopper film 130.

The first and second supporters 300 and 310 may include the first material and the second material. In an implementation, the first material may be SiCN and the second material may be SiN. If the first and second supporters 300 and 310 include carbon-based material films, a bowing characteristic of the first and second supporters 300 and 310 may be reduced. However, the carbon-based material films may be vulnerable to plasma damages. Thus, when the first and second mold oxide films 200 and 210 are etched in a subsequent process, the first and second supporters 300 and 310 may also be etched. Therefore, the carbon-based material film should include an appropriate proportion of carbon. For example, a carbonaceous component may be contained in the carbon-based material film in a proportion or amount of 0.1 to 15%.

In an implementation, the first and second supporters 300 and 310 may be formed by stacking the second material on the first material and stacking the first material on the second material. For example, the first material may be SiCN and the second material may be SiN.

The first and second supporters 300 and 310 may be formed under suitable processing conditions, e.g., at a temperature range of 250 to 550° C. in temperature, using a mixed gas of $SiH_4$ and $NH_3$. In addition, nitrogen ($N_2$) or a mixed gas of nitrogen ($N_2$) and helium (He) may be used as a carrier gas. When helium (He) gas is used as a carrier gas, generation of hydrogen ($H_2$) gas may be suppressed.

Figure 4:
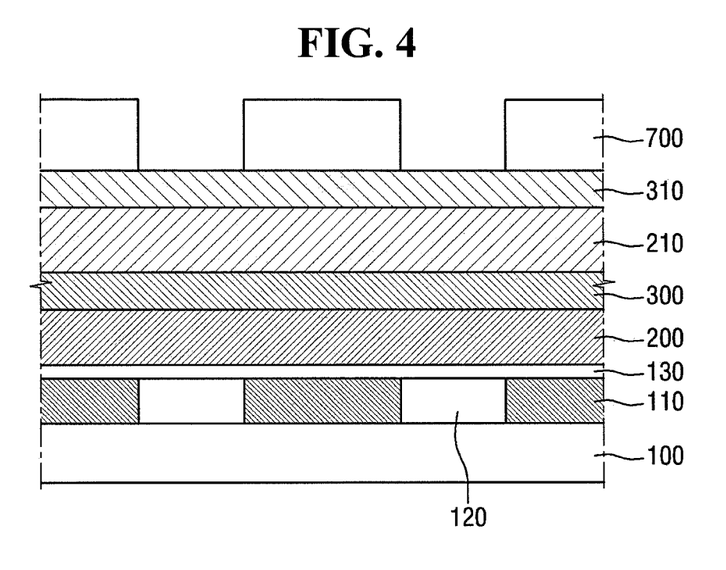
Figure 5:
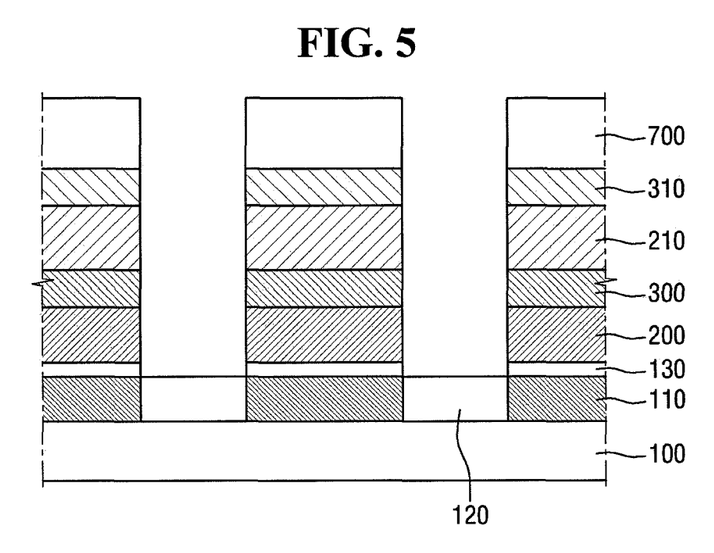

Referring to FIGS. 4 and 5, a photoresist pattern 700 may be formed. Then, the second supporter 310, the second mold oxide film 210, the first supporter 300, and the first mold oxide film 200 may be sequentially etched, and a plurality of holes may then be formed. Further, the etch stopper film 130 on the storage node contact 120 may be etched.

Figure 6:
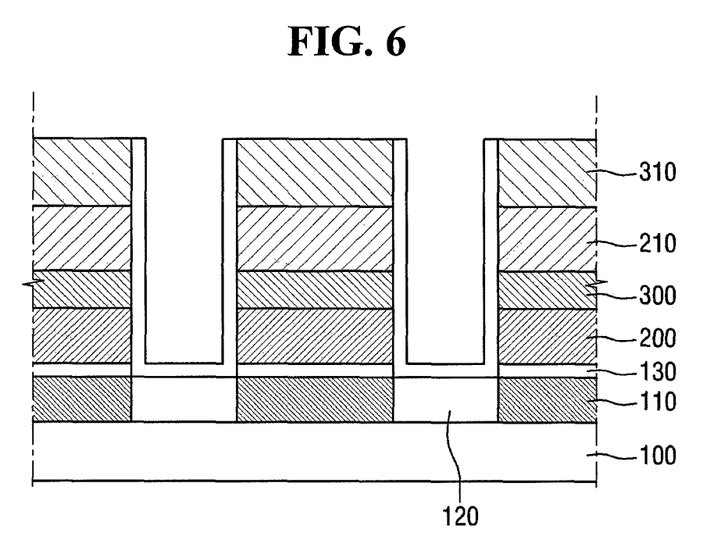

Referring to FIG. 6, the lower electrode 400 may be formed in the plurality of holes. The lower electrode 400 may be formed by, e.g., a metal organic chemical vapor deposition (MOCVD) method. In an implementation, the lower electrode 400 may be made of, e.g., titanium nitride (TiN).

Figure 7:
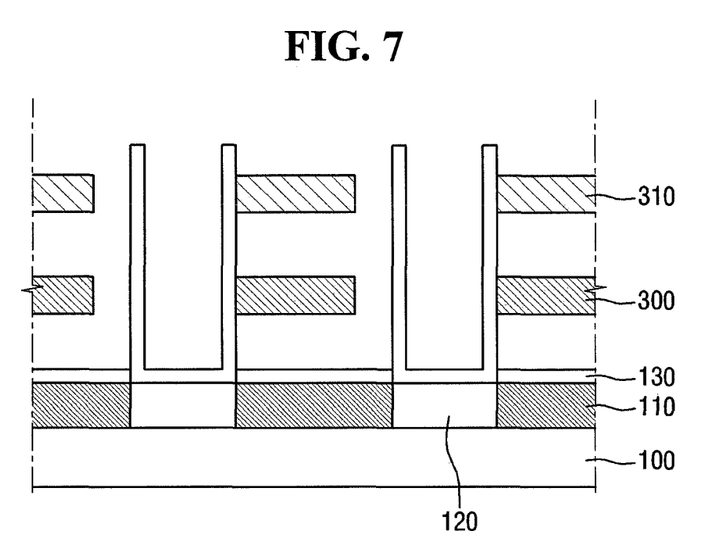

Referring to FIG. 7, remaining portions of the first and second mold oxide films 200 and 210 may be removed. The first and second mold oxide films 200 and 210 may be removed by, e.g., dry etching or wet etching.

Figure 8:
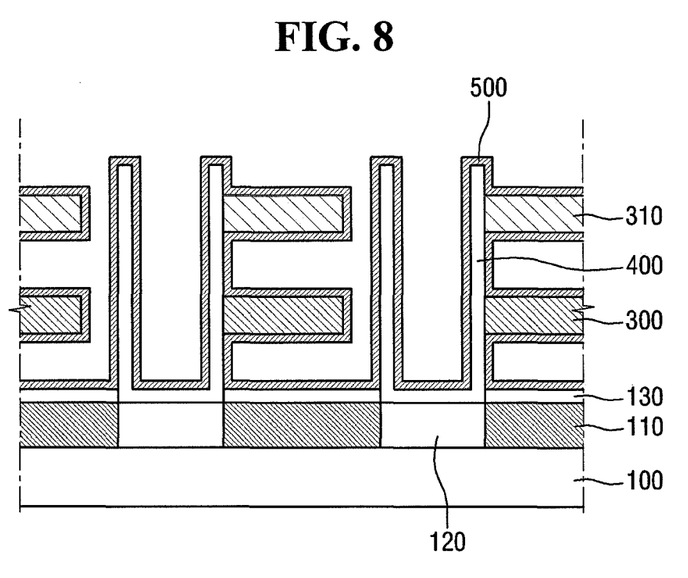

Referring to FIG. 8 together with FIG. 1, the dielectric film 500 and the upper electrode 600 may be sequentially formed on the lower electrode 400, the first and second supporters 300 and 310, and the etch stopper film 130. For example, the dielectric film 500 may be formed by stacking a metal oxide film on a nitride film or a metal nitride film. The upper electrode 600 may be formed on the dielectric film 500.

Figure 9:
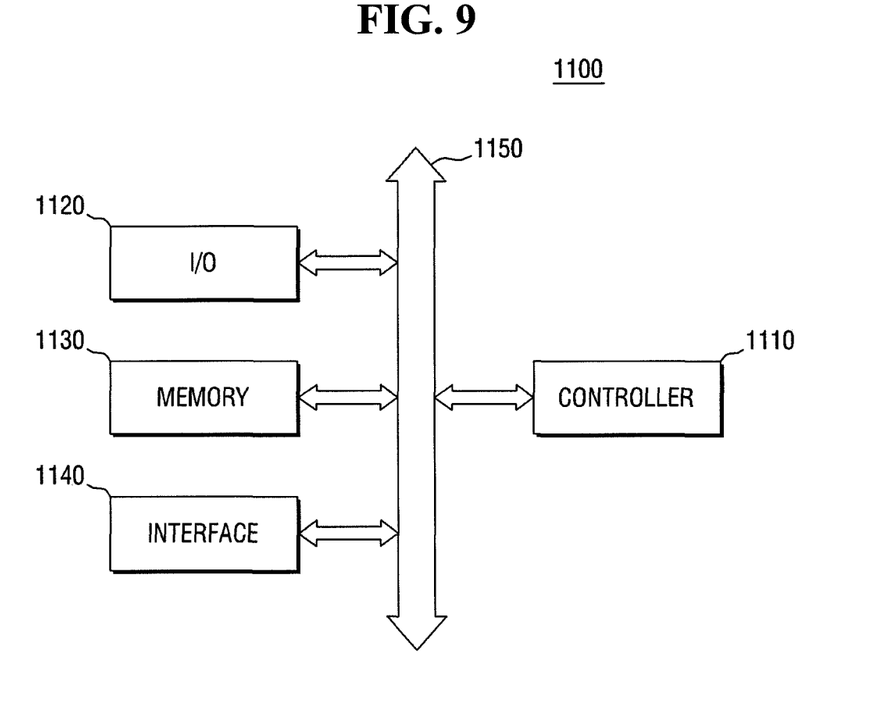
FIG. 9 illustrates a block diagram of an electronic system incorporating a semiconductor device according to an embodiment.

FIG. 9 illustrates a block diagram of an electronic system incorporating a semiconductor device according to an embodiment.

Referring to FIG. 9, the electronic system 1100 according to the present embodiment may include a controller 1110, an input/output (I/O) device 1120, a memory device 1130, an interface 1140, and a bus 1150. The controller 1110, the I/O device 1120, the memory device 1130, and/or the interface 1140 may be connected to each other through the bus 1150. The bus 1150 may corresponds to a path through which data moves.

The controller 1110 may include at least one of a microprocessor, a digital signal processor, a microcontroller, or logic devices capable of performing similar functions to those performed by these devices. The I/O device 1120 may include a keypad, a keyboard, a display device, or the like. The memory device 1130 may store data and/or instructions. The interface 1140 may transmit/receive data to/from a communication network. The interface 1140 may be wired or wireless. For example, the interface 1140 may include an antenna or a wired/wireless transceiver. Although not shown, the electronic system 1100 may be used as an operating memory for improving the operation of the controller 1110 and may further include a high-speed DRAM and/or SRAM. The fin-type transistor according to embodiments may be provided within the memory device 1130 or may be provided as a component of the controller 1110 or the I/O device 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 10:
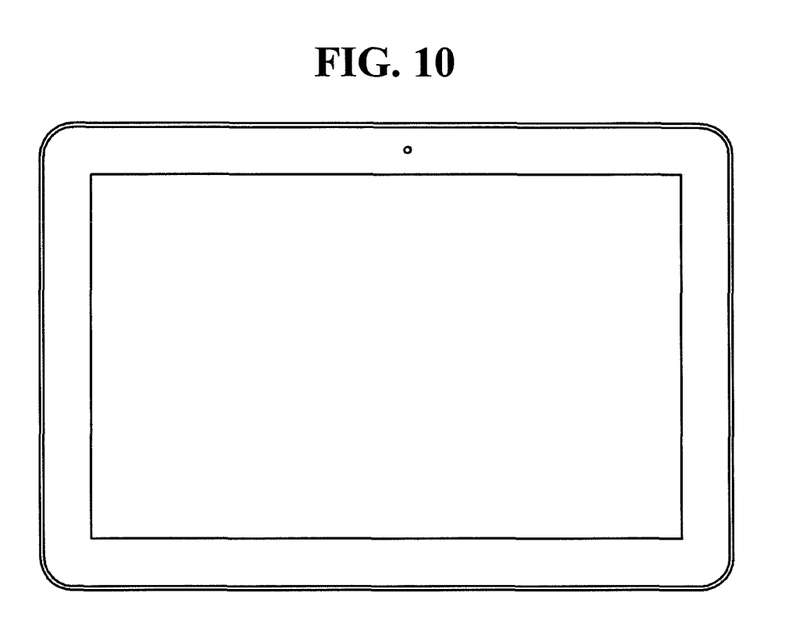
FIGS. 10 and 11 illustrate an exemplary semiconductor system to which the semiconductor device according to an embodiment can be applied.
Figure 11:
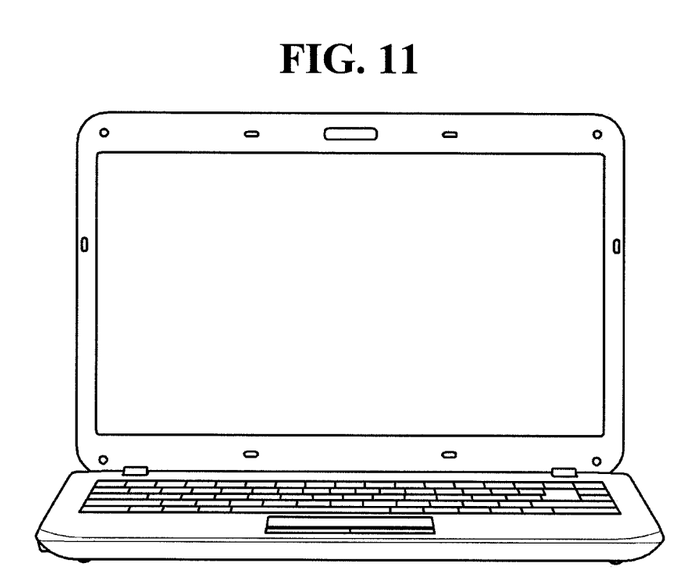

FIGS. 10 and 11 illustrate an exemplary semiconductor system to which the semiconductor device according to an embodiment may be applied. For example, FIG. 10 illustrates a tablet PC and FIG. 11 illustrates a notebook computer. The semiconductor device according to an embodiment may be applied to a tablet PC, a notebook computer, or the like.

By way of summation and review, in order to increase an effective area of a lower electrode, the lower electrode may be formed in a three-dimensional manner, and a height of the lower electrode may then be increased. For example, the lower electrode may be formed as a cylinder type, a stack type, a concave type, or the like. In such cases, the area of the lower electrode may be advantageously increased. However, as the height of the lower electrode increases, the lower electrode may be prone to collapse or breaking. In order to form a secured structure of the lower electrode, a supporter or a stopper may be employed.

The embodiments may provide a semiconductor device including a supporter for attaining a secured structure of a lower electrode in forming a capacitor.

The embodiments may also provide a method for fabricating a semiconductor device, the method including forming a supporter for attaining a secured structure of a lower electrode in forming a capacitor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate having a transistor formed thereon;
   a plurality of lower electrodes formed on the substrate;
   a first supporter and a second supporter on one of the plurality of lower electrodes;
   a dielectric film formed on the lower electrode, the first supporter, and the second supporter; and
   an upper electrode formed on the dielectric film,
   wherein the first and second supporters are positioned between the adjacent lower electrodes, the first and second supporters are formed to be spaced apart from each other, and the first and second supporters include SiCN.

2. The semiconductor device as claimed in claim 1, wherein the first and second supporters have thicknesses in a range of 50 Å to 3,000 Å.

3. A semiconductor device, comprising:
   a substrate including a unit device;
   a plurality of lower electrodes on the substrate;
   a first supporter and a second supporter on sides of each of the lower electrodes;
   a dielectric film on the lower electrode, the first supporter, and the second supporter; and
   an upper electrode on the dielectric film,
   wherein:
   the first supporter and the second supporter are between adjacent ones of plurality of the lower electrodes,
   the first and second supporters include SiCN, and
   the first supporter and the second supporter suppress bowing of the plurality of lower electrodes.

4. The semiconductor device as claimed in claim 3, wherein the first supporter and the second supporter are spaced apart from each other in a direction perpendicular to a surface of the substrate.

5. The semiconductor device as claimed in claim 3, wherein the first and second supporters have thicknesses in a range of 50 Å to 3,000 Å.

* * * * *